United States Patent [19]

Shinozaki et al.

[11] 4,105,450
[45] Aug. 8, 1978

[54] SPECTRALLY SENSITIZED POSITIVE LIGHT-SENSITIVE O-QUINONE DIAZIDE CONTAINING COMPOSITION

[75] Inventors: Fumiaki Shinozaki; Tomoaki Ikeda, both of Asaka, Japan

[73] Assignee: Fuji Photo Film Co., Ltd., Ashigara, Japan

[21] Appl. No.: 689,874

[22] Filed: May 25, 1976

Related U.S. Application Data

[63] Continuation of Ser. No. 492,816, Jul. 29, 1974, abandoned.

[30] Foreign Application Priority Data

Jul. 27, 1973 [JP] Japan .................... 48-85332

[51] Int. Cl.$^2$ .................... G03F 7/08; G03C 1/54
[52] U.S. Cl. .................... 96/33; 96/36; 96/49; 96/75; 96/91 D; 96/115 R
[58] Field of Search .............. 96/91 D, 115 R, 115 P, 96/91 R, 91 N, 75, 84 UV, 139, 140

[56] References Cited

U.S. PATENT DOCUMENTS

| | | | |
|---|---|---|---|
| 2,974,042 | 3/1961 | Sus et al. ................ | 96/91 D |
| 3,386,826 | 6/1968 | Slimowicz ................ | 96/91 R |
| 3,528,812 | 9/1970 | Danhauser et al. ........ | 96/115 R |
| 3,567,453 | 3/1971 | Border ................... | 96/91 D |
| 3,620,740 | 11/1971 | Poot .................... | 96/91 R |
| 3,635,709 | 1/1972 | Kobayashi ............... | 96/91 D |
| 3,661,582 | 5/1972 | Broyde .................. | 96/91 D |
| 3,676,133 | 3/1973 | Poot et al. ............. | 96/91 R |
| 3,733,198 | 5/1973 | Van Reusel et al. ....... | 96/56 |
| 3,743,504 | 7/1973 | Dappen et al. ........... | 96/56 |
| 3,778,274 | 12/1973 | Inoue et al. ............. | 96/33 |

FOREIGN PATENT DOCUMENTS 2,215,474 10/1973 Fed. Rep. of Germany ......... 96/91 R

OTHER PUBLICATIONS

Grant, J., "Hackh's Chem. Dictionary", 3rd. Ed., McGraw-Hill, 1944, pp. 454-456.
Kosar, J.; "Light-Sensitive Systems", Wiley & Sons, 1965, pp. 250-252.
Levine, H. A., IBM Tech. Disclosure Bulletin, vol. 13, No. 4, 9/1970, p. 903.

*Primary Examiner*—Charles L. Bowers, Jr.
*Attorney, Agent, or Firm*—Sughrue, Rothwell, Mion, Zinn and Macpeak

[57] ABSTRACT

A positive light-sensitive composition containing: (a) a quinonediazide type, positive light-sensitive substance and (1) (b) at least one compound selected from the group consisting of those compounds represented by the following general formulae (I)

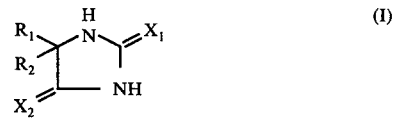

(I)

wherein $X_1$ and $X_2$ each represents an oxygen atom or a sulfur atom; $R_1$ and $R_2$ each represents a hydrogen atom, an alkyl group, an aralkyl group, an aryl group or a cycloalkyl group; (2) those compounds represented by the general formula (II)

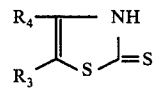

wherein $R_3$ represents a hydrogen atom, an alkyl group, an aralkyl group, an aryl group or a cycloalkyl group; and $R_4$ represents a hydrogen atom, an alkyl group or a cycloalkyl group; and (3) o-benzoic acid sulfimide.

8 Claims, No Drawings

SPECTRALLY SENSITIZED POSITIVE LIGHT-SENSITIVE O-QUINONE DIAZIDE CONTAINING COMPOSITION

This is a continuation of application Ser. No. 492,816, filed July 29, 1974.

BACKGROUND OF THE INVENTION

1. Field of the Invention

The present invention relates to a positive light-sensitive composition containing a sensitizer.

The present invention finds special application in the production of a light-sensitive layer of positive light-sensitive planographic printing plates or to the production of super-small sized circuits by irradiating a positive photoresist with electromagnetic radiation. However, the application of the present invention is not limited to these uses, only.

2. Description of the Prior Art

Quinonediazide type substances have heretofore been used as a light-sensitive substance of positive light-sensitive planographic printing plates. For example, Canadian Pat. No. 747,047 describes naphthoquinone-(1,2)-diazidosulfonic acid ester. U.S. Pat. No. 3,046,111 describes various structural formulae of the same type positive photoresists. That is, U.S. Pat. No. 3,046,111 describes the use of several kinds of diazido residues by reacting an aminohydroxy compound with a sulfonic acid or a sulfonic acid chloride. U.S. Pat. No. 3,046,112 describes, as a certain type of fundamental structure of orthoquinonediazidosulfones, the following formulae:

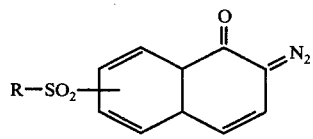
(1)

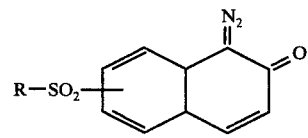
(2)

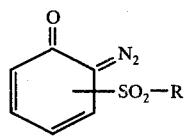
(3)

and

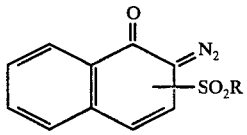
(3a)

wherein R represents an aryl group or a substituted aryl group. Many modifying methods have been suggested, and resins, dyes and other additives are being studied. U.S. Pat. No. 3,046,115 describes that the addition of an auxochromic group will increase the intensity of color.

U.S. Pat. No. 3,046,118 describes that the presence of two sulfonic acid residues bonded to an ester is advantageous in reducing the necessary heating. U.S. Pat. No. 3,148,983 suggests the following fundamental structural formula

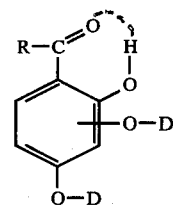
(4)

wherein D represents a naphthoquinone-(1,2)-diazido-(2)-5-sulfonyl group, and R represents an aryl group or a substituted aryl group. Further, U.S. Pat. No. 3,184,310 describes that it is advantageous that the compound contain at least one free hydroxy group and suggests the following general formula

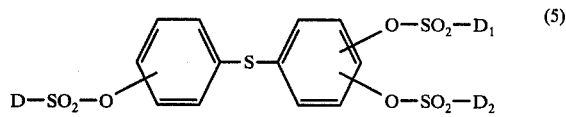
(5)

wherein D, $D_1$ and $D_2$ each represents a naphthoquinone-(1,2)-diazido group.

Other quinone diazido compounds known in the art are as follows

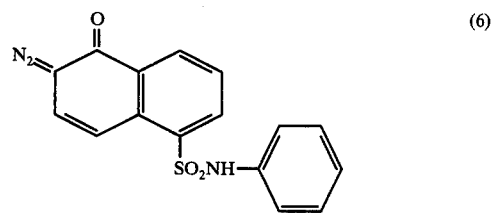
(6)

as described in Japanese Patent Publication No. 1954/62;

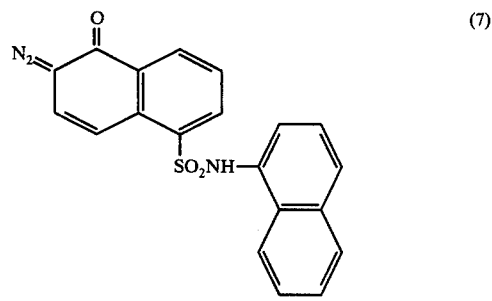
(7)

as described in German Pat. No. 854,890;

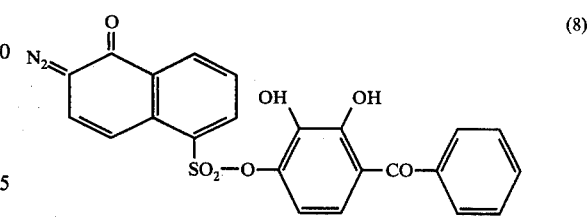
(8)

as described in German Pat. No. 938,233;

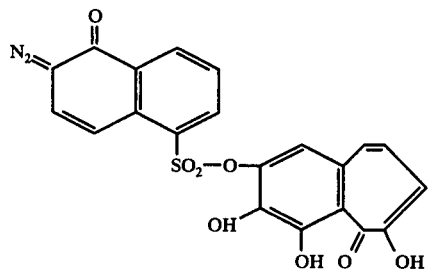

as described in German Pat. No. 1,124,817;

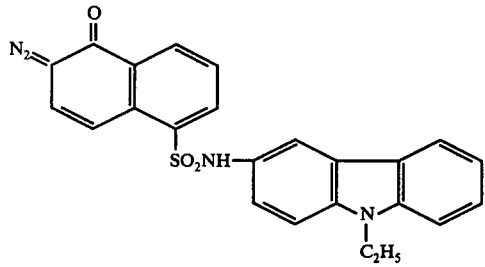

as described in U.S. Pat. No. 3,046,120 and German Pat. No. 865,860;

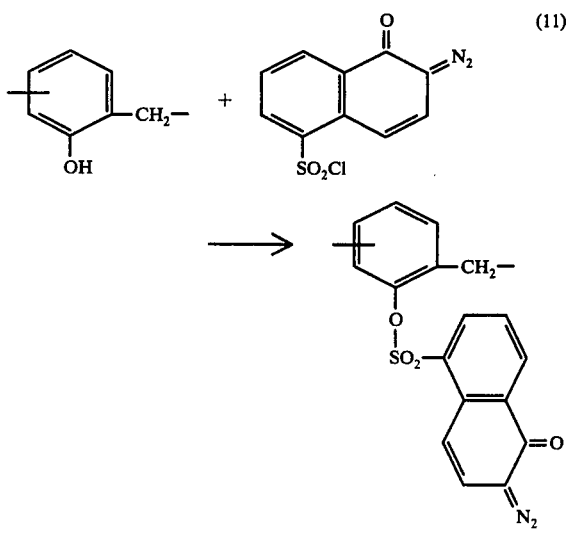

as described in Japanese Patent Publication No. 5604/70;

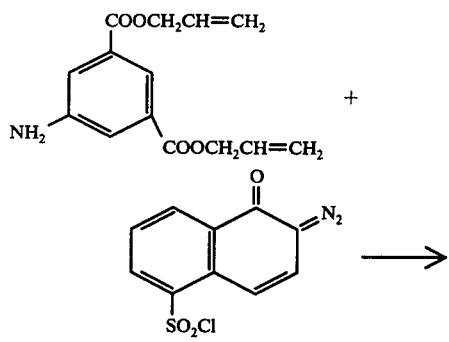

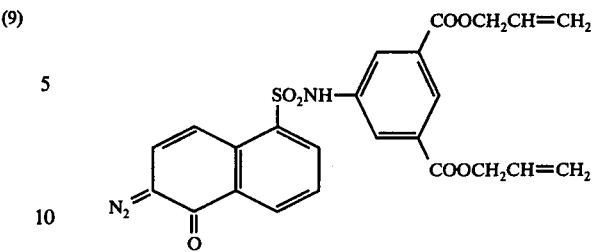

as described in Japanese Patent Publication No. 26126/65;

Ester of a polycarbonate and naphthoquinone-1,2-diazide sulfonic acid as described in Japanese Patent Publication No. 24323/69; and Ester of polyhydroxyphenyl and naphthoquinone-1,2-diazide sulfonic acid. Of the above compounds, compounds (11) to (14) are polymeric quinone diazide compounds. Of these light-sensitive materials, the light-sensitive groups are:

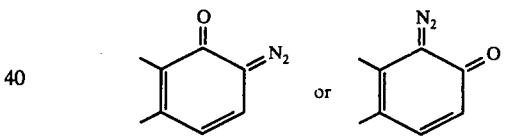

The atomic groups which bond to this group make the resist which is formed strong, and many different kinds substituents such as small atomic groups or polymer groups, etc. can be used.

SUMMARY OF THE INVENTION

An object of the present invention is to enhance the sensitivity of the quinonediazido type light-sensitive substances by incorporating a novel additive.

As a result of various research, it has been found that the compounds represented by the following general formulae (I)

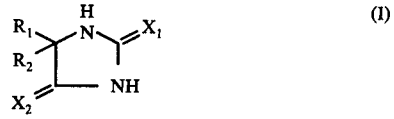

wherein $X_1$ and $X_2$ each represents an oxygen atom or a sulfur atom; $R_1$ and $R_2$ each represents a hydrogen atom, an alkyl group, an aralkyl group, an aryl group or a cycloalkyl group; by the following general formula (II)

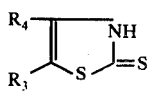

wherein $R_3$ represents a hydrogen atom, an alkyl group, an aralkyl group, an aryl group or a cycloalkyl group; $R_4$ represents a hydrogen atom, an alkyl group or a cycloalkyl group; and or o-benzoic acid sulfimide are effective for enhancing the sensitivity of quinonediazido type light-sensitive substances, thus achieving the present invention.

DETAILED DESCRIPTION OF THE INVENTION

In the above general formula (II) $X_1$ and $X_2$ each represents an oxygen atom or a sulfur atom; $R_1$ and $R_2$ each represents a hydrogen atom, an alkyl group (preferably, an alkyl group having 1 to 4 carbon atoms, such as a methyl group, an ethyl group, a propyl group, an isopropyl group, a butyl group, a t-butyl group, etc.), an aryl group (e.g., a phenyl group, a tolyl group, etc.), an aralkyl group (e.g., a benzyl group, a phenethyl group, etc.), or a cycloalkyl group (e.g., a cyclopentyl group, a cyclohexyl group, etc.).

In the above general formula (II) $R_3$ represents a hydrogen atom, an alkyl group (suitably, an alkyl group having 1 to 4 carbon atoms, such as a methyl group, an ethyl group, a propyl group, a butyl group, a t-butyl group, etc.), an aralkyl group (preferably, a benzyl group, a phenethyl group, etc.), an aryl group (preferably, a phenyl group, a tolyl group, etc.), or a cycloalkyl group (preferably, a cyclopentyl group, a cyclohexyl group, or the like); and $R_4$ represents a hydrogen atom, an alkyl group (preferably, an alkyl group having 1 to 4 carbon atoms, such as a methyl group, an ethyl group, a propyl group, a butyl group, a t-butyl group, etc.), or a cycloalkyl group (e.g., a cyclopentyl group, a cyclohexyl group, etc.).

Specific examples of compounds having the general formula (I) include hydantoin, thiohydantoin, 5,5-diphenylthiohydantoin, 5,5-dimethylthiohydantoin, 5-phenyl-5-ethylhydantoin, 5-methyl-5-isopropylthiohydantoin, 5,5-diethylhydantoin and 5-methyl-5-cyclohexylhydantoin and examples of compounds having the general formula (II) include 5-methylthiazoline-2-thione, 5-ethylthiazoline-2-thione, 4,5-dimethylthiazoline-2-thione, 5-phenylthiazoline-2-thione, 5-cyclohexylthiazoline-2-thione, 5-benzylthiazoline-2-thione.

In this invention, the combination of at least one of the compounds of general formula (I), the general formula (II), and o-benzoic sulfimide is used, with at least one quinone diazide compound, e.g., as described hereinbefore.

The above-described compounds are suitably added to the light-sensitive composition in an amount of not less than about 0.1% by weight up to less than about 50% by weight, preferably 1 to 20% by weight.

The quinonediazido type light-sensitive substances which can be used in the present invention include, in general, all of the above-described compounds.

The light-sensitive quinone diazide compound and the composition which comprises the compounds of this invention are employed in combination as the light-sensitive composition. If the quinone diazide compound has a film-forming property, an organic solvent solution of the light-sensitive composition is used as a coating solution. If the quinone diazide compound does not have a film-forming property, the coating solution comprises an organic solvent solution of the light-sensitive composition and an additional binder component. Suitable examples of binders include phenol-formaldehyde resins, shelac, styrenemaleic anhydride copolymers, methyl methacrylate-methacrylate copolymers, and the binder is suitably added at less than 5 times by weight. Suitable solvents which can be used for the coating solution include alcohol solvents such as methanol, ethanol, isopropyl alcohol, and butyl alcohol, dioxane, methyleneglycolmonomethylether, ethyleneglycolmonomethylether, etc. of these, a solvent which dissolves the solid components can be employed alone or a mixture of solvents can be employed. The concentration of the solid components of the coating solution normally is about 1 to 20 weight % and the coating amount on the support generally is about 0.1 to 10 g per 1 $m^2$.

The light-sensitive composition of the invention can be applied from solution to a variety of supports. Such supports include cloth, paper, ceramics, rubber, wood, metals, plastic films, and the like. The desired image is then produced by image wise exposure to actinic radiation, such as ultraviolet light, and can be used as such as a temporary record or the unexposed materials can be removed by treatment with an appropriate solvent to produce a permanent image.

In an embodiment a photoresist composition is prepared employing the light-sensitive composition of the invention mixed with a film-forming resin. For example, the film-forming resin can be a phenol formaldehyde resin such as those known as novolak or resole resins. In a particular, an alkali soluble phenol formaldehyde resin can be used to form a product which is insoluble in alkali but which forms decomposition products which are soluble in dilute alkali upon exposure to actinic rays. The alkali solution may range in strength up to that of 5% aqueous sodium hydroxide.

The light-sensitive composition of this invention can be mixed in any proportion with a film-forming material to form resists or print-out materials. In addition the light-sensitive compositions can be provided in a dry form and mixed with a solvent or as a solvent solution using one or more volatile organic solvents which are solvents for the components of the light-sensitive composition. Residual solvent can be removed and the coating is exposed through a pattern to a light source such as a carbon arc. The resist coating, is then placed in a developer such as an aqueous alkaline developer, to remove the exposed areas. The alkaline strength of the developer, as well as the presence of addenda such as solvents, is dependent upon the particular light-sensitive composition employed, any the resin employed and the ratio of the light-sensitive composition to the resin. The developer may also contain dyes and hardening agents. The developed image is rinsed with water, and dried. The substrate can then be etched using conventional techniques such as an acid etching solutions of ferric chloride.

In another embodiment a solution containing the light-sensitive composition of this invention is coated upon a lithographic support by using conventional techniques such as whirl coating, flow coating, dip coating, hopper coating, etc. and allowed to dry. The resulting light-sensitive element is then exposed through a negative image to radiation such as that from an ultraviolet light source and subsequently developed with a solvent for the unexposed portions to obtain a positive, highly colored, oleophilic image suitable for use in lithographic printing.

The lithographic support materials can be any of those well known in the art such as zinc, anodized aluminum, grained aluminum, copper and specially prepared metal and paper supports; partially hydrolyzed cellulose ester films; polymer supports such as polyolefins, polyesters, polyamide, etc.

The solvents which can be employed as coating solvents for the light sensitive composition of this invention are preferably those organic solvents which are capable of dissolving at least 0.2% by weight of the light sensitive composition employed but are inert to the components in the light sensitive composition and which are substantially incapable of adversely affecting the substrates employed. Suitable solvents include dimethylformamide, cyclohexanone, acetonitrile, 2-ethoxyethanol and mixtures thereof or with other solvents such as the lower alcohols and ketones.

The coating solutions can also contain addenda to improve film formation, coating properties, adhesion to the supports, mechanical strength, etc. Examples of such include resins, stabilizers and surface active agents.

The light sensitive elements can be exposed using conventional techniques to actinic radiation which is preferably in the ultraviolet range. The exposed elements are then developed by washing, soaking, swabbing, or otherwise treating the light sensitive layers with a solvent or solvent system which acts on the exposed and unexposed areas removing the materials which have not been modified by the action of light. These developing solvents can be organic or aqueous in nature and will vary depending on the composition of the light sensitive layer being developed. Examples of developing solvents include water, aqueous acids and alkalis, the lower alcohols and ketones, and aqueous solutions of the lower alcohols and ketones. The images formed can then be treated in any known manner dependent upon the intended end use.

The light-sensitive composition of the present invention possesses such high sensitivity that the exposure amount upon exposure can be reduced as compared with the conventional light-sensitive compositions. Thus workability is improved.

The present invention will now be illustrated in greater detail by reference to the following non-limiting examples of preferred embodiments of the present invention. Unless otherwise indicated all parts, percents, ratios and the like are by weight.

EXAMPLE 1

A 3S 18H aluminum plate was grained on both sides using 25-mesh Alundum, then immersed for 1 minute in a 70° C aqueous solution of 20% sodium tertiary phosphate. After being washed with water, the plate was immersed in a 70% nitric acid solution, followed by washing with water. Thereafter, the plate was immersed for 2 minutes in a bath of 2% aqueous solution of sodium silicate No. 2 (made by Kanto Kagaku Co.; $SiO_2/Na_2O$ ratio: 2.45 - 2.55:1) heated to 80 to 85° C. After being washed with water and drying the plate, a light-sensitive solution prepared by adding 1 part by weight of polyhydroxyphenyl 2-diazo-1-naphthol-4-sulfonic acid ester (obtained by the polycondensation of acetone and pyrogallol as illustrated in Example 1 of U.S. Pat. No. 3,635,709) and 2 parts by weight of an oil-soluble novolak-type phenol resin PR-50904 (made by Sankyo Chemical Co., Ltd.) to a mixed solution of 10 parts by weight of methyl ethyl ketone, and 10 parts by weight of methoxyethanol for dissolution was applied to the aluminum plate in a dry thickness of 1.2 $\mu$ to obtain light-sensitive Printing Plate A.

On the other hand, 0.18 part by weight of 5,5-diphenylthiohydantoin was further added to the above-described light-sensitive solution, and then applied to the same aluminum plate as described above in the same thickness to obtain light-sensitive Printing Plate B.

The thus obtained light-sensitive Printing Plates A and B were exposed for the same period of time through a step-wedge using a super-high pressure mercury lamp printing apparatus (made by ORC Manufacturing Co., Ltd.; trade name: Jet-Printer 2000), then developed under the same conditions using a 5% sodium tertiary phosphate aqueous solution. The sensitivity of the light-sensitive Printing Plate B was found to be enhanced about 1.5 times as compared with light-sensitive Printing Plate A. When printing was effected using the thus obtained printing plates, both printing plates provided excellent impressions.

EXAMPLE 2

When the same procedures as described in Example 1 were conducted except for using 1 part by weight of hydantoin in lieu of 5,5-diphenylthiohydantoin, the sensitivity was similarly enhanced approximately 1.5 times.

EXAMPLE 3

The same procedures as described in Example 1 were conducted except for using 0.7 part by weight of 2,2-bis[p-(naphthoquinone-(1,2)-diazido-(2)-5-sulfonyloxy)-phenyl] propane. The same results as in Example 1 were obtained.

EXAMPLE 4

The same procedures as described in Example 1 were conducted except for using 0.18 part by weight of o-benzoic acid sulfimide in lieu of 5,5-diphenylthiohydantoin. The same results as in Example 1 were obtained.

EXAMPLE 5

The same procedures as described in Example 3 were conducted except for using 0.18 part by weight of o-benzoic acid sulfimide in lieu of 5,5-diphenylthiohydantoin. The same results as in Example 1 were obtained.

EXAMPLE 6

The same procedures as described in Example 1 were conducted except for using 0.18 part by weight of 5-methylthiazoline-2-thione in lieu of 5,5-diphenylthiohydantoin.

While the invention has been described in detail and with reference to specific embodiments thereof, it will be apparent to one skilled in the art that various changes and modifications can be made therein without departing from the spirit and scope thereof.

What is claimed is:

1. A process for producing a positive image from a light-sensitive element comprising a lithographic support having thereon a coated layer of a positive light-sensitive composition containing (a) an o-quinonediazide type, positive light-sensitive substance selected from the group consisting of o-quinonediazide sulfonic acid esters and amides and o-quinonediazide sulfones and in admixture therewith in an effective amount to enhance sensitivity of the o-quinonediazide (b) at least one compound selected from the group consisting of (1) 5-methylthiazoline-2-thione; and $R_4$ represents a hydrogen atom, an alkyl group or a cycloalkyl group; and (2) o-benzoic acid sulfimide to form a planographic printing plate said process comprising image-wise exposing of the planograhic printing plate to actinic radiation and treating the exposed planograhic printing plate with the developer solution containing at least one alkali material, thereby obtaining a positive oleophilic image for planographic printing.

2. The process of claim 1 wherein 5-methylthiazoline-2-thione is used and is present in said composition in an amount of not less than 0.1 percent by weight up to less than 50% by weight based on weight of said composition.

3. The process of claim 1 wherein said o-quinonediazide-type positive light-sensitive substance is 2-diazo-1-naphthol-4-sulfonate of polyhydroxyphenyl obtained by condensing acetone and pyrogallol.

4. The process of claim 1 wherein said o-quinonediazide-type positive light-sensitive substance is 2,2-bis[p-(naphthoquinone-(1,2)-diazido-(2)-5-sulfonyloxy)-phenyl] propane.

5. A positive light-sensitive composition containing:
(a) an o-quionediazide type, positive light-sensitive substance selected from the group consisting of o-quinonediazide sulfonic acid esters and amides and o-quinonediazide sulfones and in admixture therewith in an effective amount to enhance sensitivity of the o-quinonediazide (b) at least one compound selected from the group consisting of:

(1) 5-methylthiazoline-2-thione wherein $R_3$ represents a hydrogen atom, an alkyl group, an aralkyl group, and $R_4$ represents a hydrogen atom, an alkyl group or a cycloalkyl group; and
(2) o-benzoic acid sulfimide.

6. The light-sensitive composition of claim 1, wherein 5-methylthiazoline-2-thione is used and is present in said composition in an amount of not less than about 0.1% by weight up to less than 50% by weight based on weight of said composition.

7. A light-sensitive composition of claim 1, wherein said oquinonediazide-type positive light-sensitive substance is 2-diazo-1-naphthol-4-sulfonate of polyhydroxyphenyl obtained by condensing acetone and pyrogallol.

8. The light-sensitive composition of claim 1, wherein said o-quinonediazide-type positive light-sensitive substance is 2,2-bis[p-(naphthoquinone(1,2)-diazido-(2)-diazido-(2)-5-sulfonyloxy)-phenyl] propane.

* * * * *